(12) United States Patent
Konja et al.

(10) Patent No.: US 12,237,124 B2
(45) Date of Patent: Feb. 25, 2025

(54) SOLID STATE HIGH POWER BATTERY DISRUPTER

(71) Applicant: Joyson Safety Systems Acquisition LLC, Auburn Hills, MI (US)

(72) Inventors: Raad Konja, Auburn Hills, MI (US); Jason Lisseman, Auburn Hills, MI (US); Michael Moore, Auburn Hills, MI (US); Leonard Cech, Auburn Hills, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 0 days.

(21) Appl. No.: 18/374,429

(22) Filed: Sep. 28, 2023

(65) Prior Publication Data
US 2024/0029972 A1 Jan. 25, 2024

Related U.S. Application Data

(62) Division of application No. 17/565,862, filed on Dec. 30, 2021, now Pat. No. 11,776,776.

(Continued)

(51) Int. Cl.
*H01H 33/06* (2006.01)
*H01H 71/24* (2006.01)
(Continued)

(52) U.S. Cl.
CPC ........ *H01H 33/06* (2013.01); *H01H 71/2463* (2013.01); *H01L 29/78* (2013.01); *H01H 33/38* (2013.01); *H02H 7/18* (2013.01)

(58) Field of Classification Search
CPC . H01L 29/78; H01L 9/38; H01H 33/06; H01L 33/12; H01L 33/38; H01L 47/22; H01L 50/546; H01L 71/2463; H02H 7/18
(Continued)

(56) References Cited

U.S. PATENT DOCUMENTS 5,563,439 A * 10/1996 Chung ................ H01L 23/4824
257/E29.136
10,373,788 B2 8/2019 Henck
(Continued)

FOREIGN PATENT DOCUMENTS

| CN | 107533938 A | 1/2018 |
| DE | 102018131327 A1 | 6/2020 |

OTHER PUBLICATIONS

Xu, Cuidong, et al. "A Supercapacitor-Based Method to Mitigate Overvoltage and Recycle the Energy of Pantograph Arcing in the High Speed Railway," Energies 2019, 12, No. 7: 121. https://doi.org/10.3390/en12071214.

(Continued)

*Primary Examiner* — Kevin J Comber
(74) *Attorney, Agent, or Firm* — Meunier Carlin & Curfman LLC (57) ABSTRACT

A power circuit breaker has a housing defining a first passage and a cross passage through the housing. A bus bar extends through the cross passage and is configured to transmit electric power and/or break transmission of the electric power through the housing. The bus bar includes at least an input section, a coin or center section, and an output section that are separable from each other. The housing aligns a solenoid piston within the first passage of the housing. The solenoid has a piston with two opposite ends, and one of the ends operates as a plunger to separate the sections of the bus bar when the solenoid is actuated. The plunger moves the coin or center section of the bus bar out of contact with the input section and the output section of the bus bar to break electrical transmission across the bus bar.

4 Claims, 7 Drawing Sheets

Related U.S. Application Data

(60) Provisional application No. 63/133,093, filed on Dec. 31, 2020.

(51) Int. Cl.
  *H01L 29/78* (2006.01)
  *H01H 33/38* (2006.01)
  *H02H 7/18* (2006.01)

(58) Field of Classification Search
  USPC .......................................................... 361/142
  See application file for complete search history.

(56) References Cited

U.S. PATENT DOCUMENTS

| | | |
|---|---|---|
| 10,424,448 B2 | 9/2019 | Goldman et al. |
| 10,622,176 B2 | 4/2020 | Volkmann et al. |
| 2018/0102774 A1* | 4/2018 | Leong ................ H03K 17/0822 |
| 2018/0366936 A1* | 12/2018 | Kennedy .................. H02H 3/05 |
| 2019/0044512 A1* | 2/2019 | Bang .................. H03K 19/0016 |
| 2022/0328268 A1 | 10/2022 | Kesarkar et al. |

OTHER PUBLICATIONS

Ehrhardt, A., et al. "Pyrotechnic Switch with Fuse Function," Plasma Physics and Technology 6(1):91-94, 2019. doi:10.14311/ppt.2019.1.91.

* cited by examiner

SOLID STATE HIGH POWER BATTERY DISRUPTER

CROSS REFERENCE TO RELATED APPLICATIONS

This application is a divisional of and claims priority to U.S. patent application Ser. No. 17/565,862 filed on Dec. 30, 2021, now U.S. patent Ser. No. 11/776,776, which claims priority to U.S. Provisional Patent Application Ser. No. 63/133,093 filed on Dec. 31, 2020, both of which are incorporated by reference as if set forth in their entireties herein.

BACKGROUND

In the electrical grid distribution industry, various reversible and one time use methods for interrupting high current, high power DC or AC circuits have evolved, depending on the function and requirements of the system. In general, these systems are designed to increase safety and reduce system damage due to transient overload or short circuit conditions. Typical methods include fuses, electromechanical or electrical circuit breakers, electromechanical switches, and solid-state electrical switches. Functions could include transient load isolation and dissipation (e.g. lightning, or transient high/low power loading/unloading within the grid), or circuit overload and/or short circuits due to accident or component failure(s) in the grid.

The automotive industry is gradually evolving from internal combustion engines, with a separated, isolated 12V electrical grid, to hybrid-electric and fully electric vehicles operating at much higher voltages and current loads. For these vehicles, the battery, powertrain, charging system and electrical vehicle grid can operate at much higher voltages and currents. This could pose a higher electrocution threat to living creatures inadvertently exposed to the automobile power grid. Similarly, flammable components exposed to the vehicle power grid could induce a greater chance of fire, and/or creation of unsafe effluents. Furthermore, transient conditions such as crash impact can cause the high-power grid components to deviate outside of design specifications causing these unsafe conditions.

To mitigate the situation, inclusion of an electronically controlled pyrotechnic circuit interrupter has been adopted on some hybrid EV and full EV vehicles. Examples of pyrotechnic circuit breakers are shown in U.S. Pat. No. 10,373,788 and 10,622,176, both of which are incorporated by reference for background. These pyrotechnic circuit breakers are generally one time use devices which are designed to safely isolate the battery system by physically breaking a pre-designed conductive segment within the circuit. Prior art FIGS. 1A-1F illustrate one example of the pyrotechnic circuit interrupter in a time lapse series. In emergency situations, such as if a crash event is detected, an electrical pulse is activated on a control line connected to the pyrotechnic interrupter. This pulse is sufficient to initiate a spark which triggers a controlled explosion of predetermined chemicals constrained in a mechanical element such that the induced pressure change activates a moving mechanical element which severs (cuts, punches, . . . ) the pre-designed conductive segment as fast and with as little transient changes in voltage and/or current as possible.

The design of the electromechanical disruptor must consider the complex physical interactions that can occur during the interruption for high current, high voltage circuits. For example, as the severing of the circuit element occurs, energy density increases in the increasingly thin conductive segment, eventually causing a propensity for arcing and/or temperature phase changes (e.g. plasma) can occur. These conditions can induce transient unsafe voltages, currents and/or chemical effluents (e.g. plasma interacting with melting or vaporizing metals, housings, etc.). Some methods to reduce the unintended effects of the interrupter process are to coat the circuit element with high temperature insulator material, provide a mechanical fixation method for the displacing circuit element so that arcing potential is mitigated, using chemical insulators and thermal damping agents to reduce unsafe effluents and pre-simulating the system design and interrupter process to optimize the device size, complexity and cost while reliably achieving the severing process. One critical disadvantage of the pyrotechnical interrupter is that it is "one time use" and cannot be reset, for example in a threshold crash event. In such a case, the only method to return the EV circuit to operational mode, is to fully replace the pyrotechnic interrupter.

A need exists for new developments in circuit breaker technology, particularly within the above referenced vehicle industry using batter powered circuit grids of extremely high voltages.

BRIEF SUMMARY OF THE DISCLOSURE

The embodiments of this disclosure include a power circuit breaker having a housing defining a first passage through the housing and a cross passage through the housing, wherein the first passage and the cross passage intersect inside the housing. A bus bar extends through the cross passage of the housing, the bus bar configured to transmit electric power and/or break transmission of the electric power through the housing. The bus bar includes at least an input section, a coin section, and an output section, and the input section, the coin section, and the output section are separable from each other. The housing aligns a solenoid piston within the first passage of the housing. The solenoid piston is surrounded by an electromagnet connected to a power source. The solenoid has a piston with two opposite ends, and one of the ends operates as a plunger to separate the sections of the bus bar when the solenoid is actuated. One of the two opposite ends of the solenoid piston, is, therefore, a plunger end of the piston, and the plunger end has an insulated cap thereon. In one embodiment, the insulated cap is aligned with the coin section of the bus bar in the cross passage of the housing. A spring within the first passage of the housing engages a portion of the housing and also engages the coin section of the bus bar on a side of the bus bar opposite the insulated cap of the solenoid piston. Linear motion of the solenoid piston through the first passage provides corresponding motion of the coin section of the bus bar onto the spring, disrupting an electric power transmission from the input section to the output section of the bus bar.

In yet another embodiment, a circuit breaker system includes a field effect transistor having a source terminal, a gate terminal, and a drain terminal attached to a substrate body to control electrical conduction there through. A bus bar for electrical power transmission has an input section connected to the source terminal and an output section connected to the drain terminal of the field effect transistor. A separate control voltage is connected to the substrate at the gate terminal, wherein a positive voltage bias on the gate terminal provides a path for the electrical power transmission through the substrate, and a negative voltage bias on the gate terminal breaks electrical power through the substrate.

The substrate is doped to establish a p-n junction sufficient to withstand the electric power transmission and break the circuit from source to drain when the gate terminal is reverse biased.

BRIEF DESCRIPTION OF THE DRAWINGS

These and other features, aspects, and advantages of the present invention will become apparent from the following description and the accompanying exemplary embodiments shown in the drawings, which are briefly described below.

DETAILED DESCRIPTION

The system is designed to achieve equal or even improved performance (e.g. circuit power, cutoff time, transient current/power suppression) in comparison to state-of-the-art, one-time-use pyrotechnical high power electrical circuit disruption but allow for the system to be reset (a number of times, dependent on the design requirements) in one of several to be described methods (including electrical, electromechanical, mechanical) and where the circuit disruption can consist of one or more embodiments as described below.

In a first embodiment, the electric disruption is purely achieved electrically for example where the desired high voltage, high current DC electrical flow is maintained through one or more hi-power Field Effect Transistors (FET) while a target threshold gate voltage is applied through the one or more FET gate nodes. The circuit disruption would be achieved through a controlled reduction of the gate voltage and could be achieved via simultaneous controlled drops or cascaded drops in such a way as to achieve the target response time for the applied voltage and current loading while minimizing (or neutralizing completely) the creation of undesired plasma energies and resulting effluents. The size, shape, doping and silicon mass of the FET body could be adapted to optimize thermal conductivity and neutralize these undesirable effects. The FET external packaging could also be designed (materials, size, shape, etc.) to dissipate thermal loading due to resetting the circuit and/or terminating the circuit.

Figure 1A:
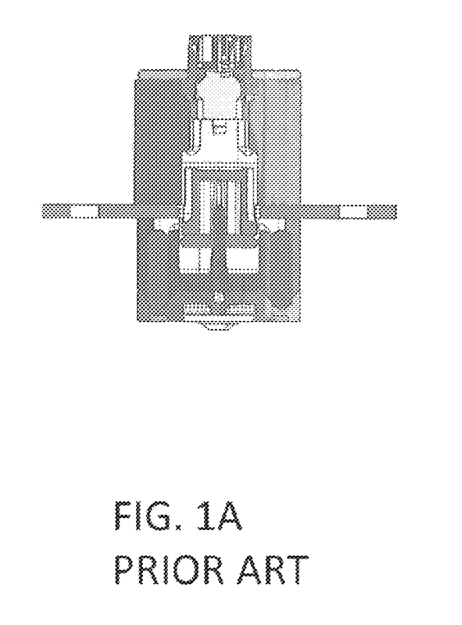
FIG. 1A is a PRIOR ART figure of a pyrotechnic circuit breaker as described in the background of this disclosure
Figure 1B:
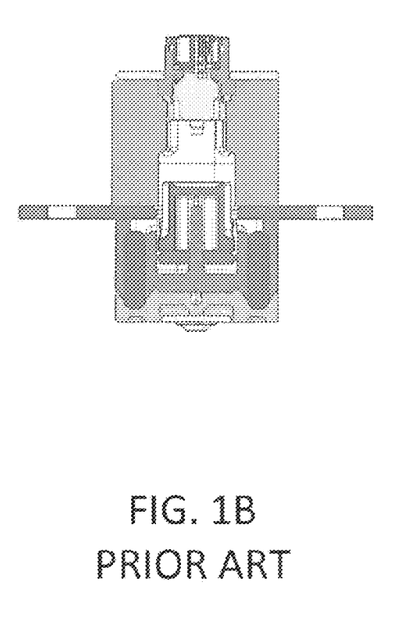
FIG. 1B is a PRIOR ART figure of a pyrotechnic circuit breaker as described in the background of this disclosure
Figure 1C:
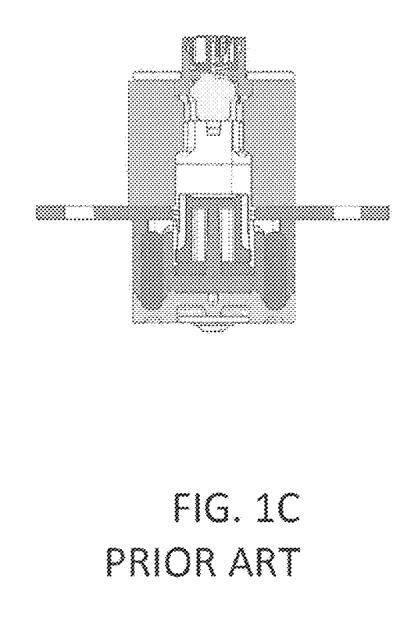
FIG. 1C is a PRIOR ART figure of a pyrotechnic circuit breaker as described in the background of this disclosure
Figure 1D:
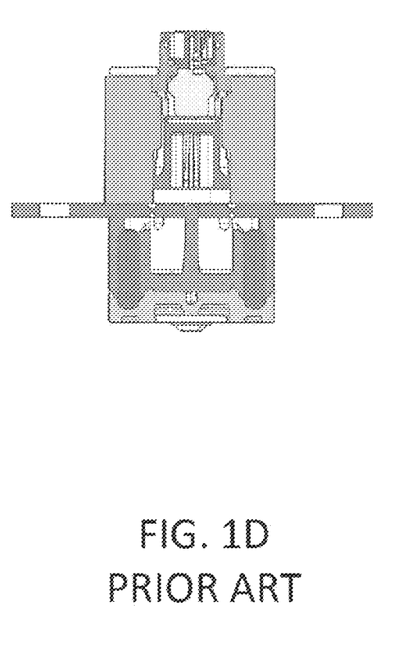
FIG. 1D is a PRIOR ART figure of a pyrotechnic circuit breaker as described in the background of this disclosure
Figure 1E:
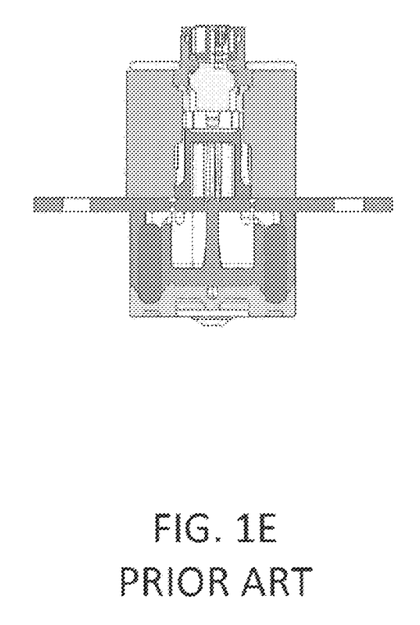
FIG. 1E is a PRIOR ART figure of a pyrotechnic circuit breaker as described in the background of this disclosure
Figure 1F:
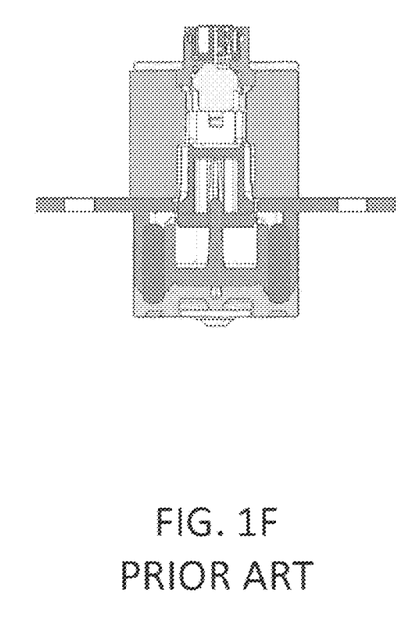
FIG. 1F is a PRIOR ART figure of a pyrotechnic circuit breaker as described in the background of this disclosure
Figure 2:
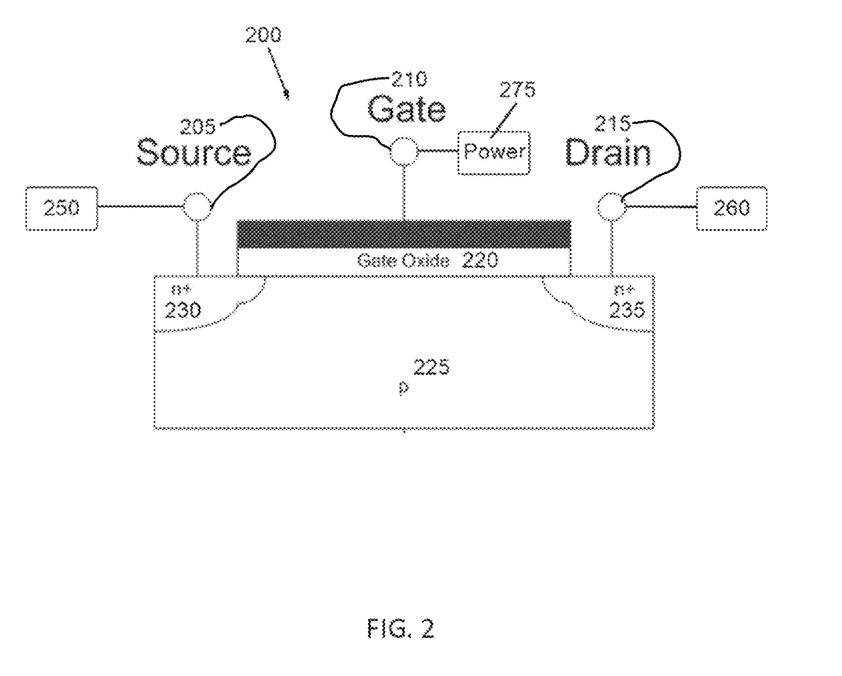
FIG. 2 is a circuit breaker embodiment of this disclosure embodied in a transistor such as a field effect transistor (FET).

This transistor embodiment is shown, for example, in FIG. 2, disclosing a circuit breaker system that includes a field effect transistor 200 having a source terminal 205, a gate terminal 210, and a drain terminal 215 attached to a substrate body 225 to control electrical conduction there through. A bus bar for electrical power transmission has an input section 250 connected to the source terminal 205 and an output section 260 connected to the drain terminal 215 of the field effect transistor 200. A separate control voltage 275 is connected to the substrate 225 at the gate terminal with an optional gate oxide 220, wherein a positive voltage bias on the gate terminal 210 provides a path for the electrical power transmission through the substrate 225, and a negative voltage bias on the gate terminal breaks electrical power through the substrate. The substrate is doped at doping sections 230, 235 to establish a p-n junction sufficient to withstand the electric power transmission and break the circuit from source to drain when the gate terminal is reverse biased. In some embodiments, the reverse biased gate terminal comprises a gate voltage that is iteratively lowered over time. The time over which the gate voltage is lowered corresponds to a response time of the substrate in establishing a p-n junction that discontinues electric power transmission from the source to the drain. At least one of a size of the substrate, a shape of the field effect transistor, a doping profile of the substrate, and a silicon mass of the substrate corresponds to a thermal conductivity response of the substrate during electric power transmission. The gate voltage is controlled by an electronic control unit comprising a processor and computerized memory storing electric power transmission software therein. In some embodiments, an external packaging connected to the field effect transistor serves as a heat sink to dissipate thermal loading across the substrate. The substrate may be made of silicon and other semiconductors.

Another embodiment may include an electromechanical termination where two high voltage/high current circuit elements are rigidly fixed to achieve the nominal high current, high voltage DC load through one or more release spring(s) and an associated holding solenoid(s) network where the springs are working to release the rigidly fixed two elements (e.g. disrupt the high voltage, high current circuit element) but are counter-acted through the active solenoids (such that the solenoid opposing force exceeds the spring element disrupting force). The solenoid circuit can be controlled to terminate and/or reset the circuit as required in operation. The solenoid and spring elements could be reversed functionally such that the spring retains the high voltage, high power circuit and the activated solenoid acts to disrupt the circuit. In such case, the system could also include a mechanical lock mechanism that is activated when the two circuit elements are separated during disruption as to stay disconnected. The locking mechanism and the solenoid action can be further designed to only allow for resetting the circuit under desired target conditions to maximize safety and minimize transient energy, plasma, effluents, etc. Also, the resetting mechanism could also be achieved through electromechanical actuation in additional to manual mechanical resetting.

Figure 3A:
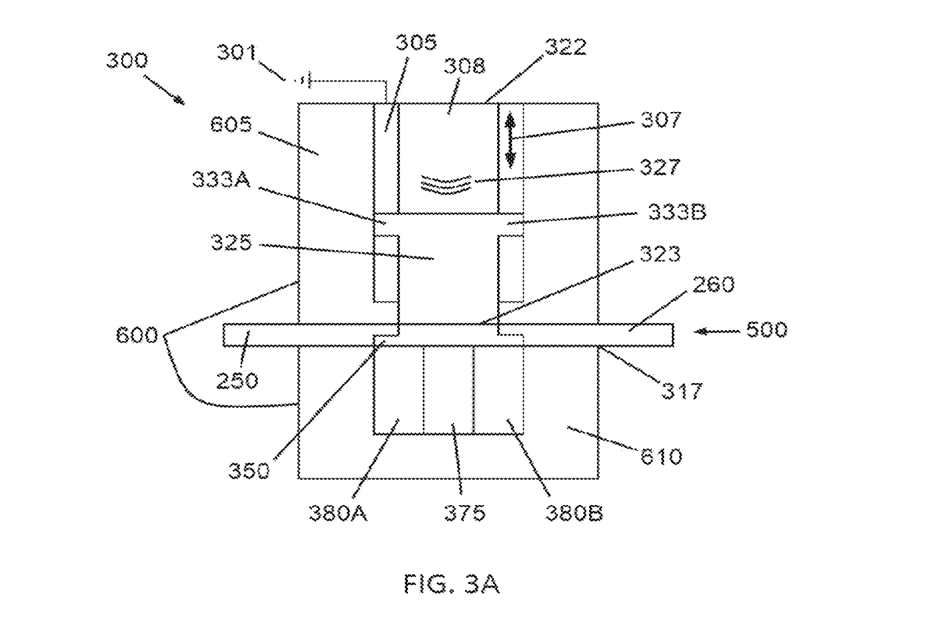
FIG. 3A is a cross section view of a circuit breaker as disclosed herein in a de-activated state as set forth in this disclosure.
Figure 3B:
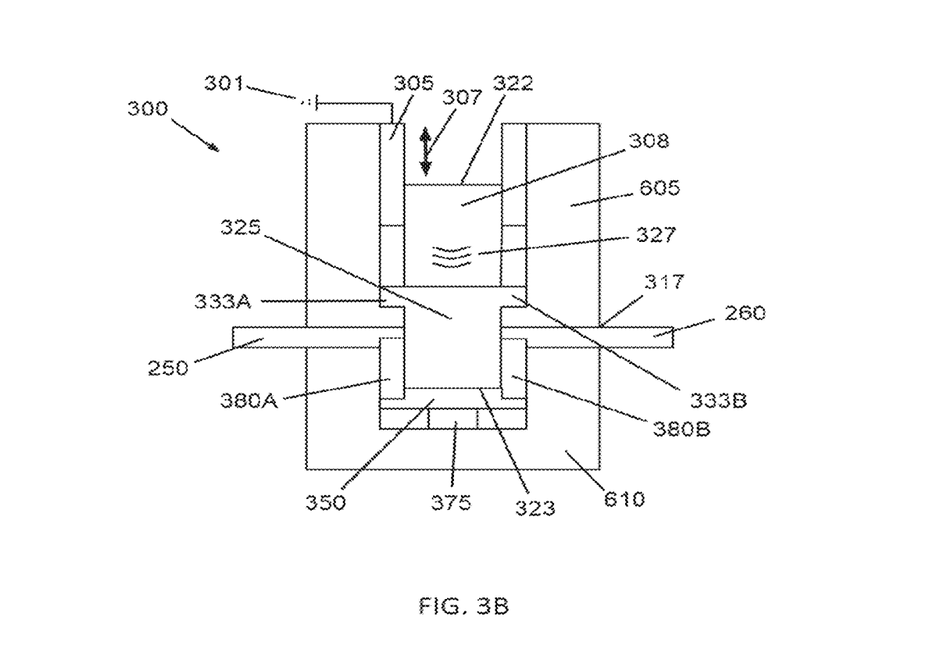
FIG. 3B is a cross section view of a circuit breaker as disclosed herein in an activated state as set forth in this disclosure.
Figure 4:
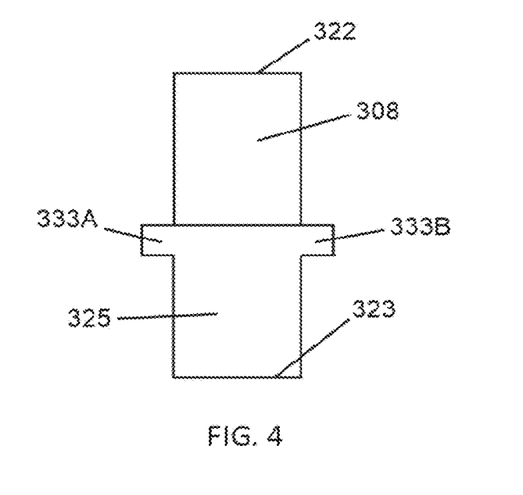
FIG. 4 is a cross section view of a solenoid piston according to this disclosure.
Figure 5:
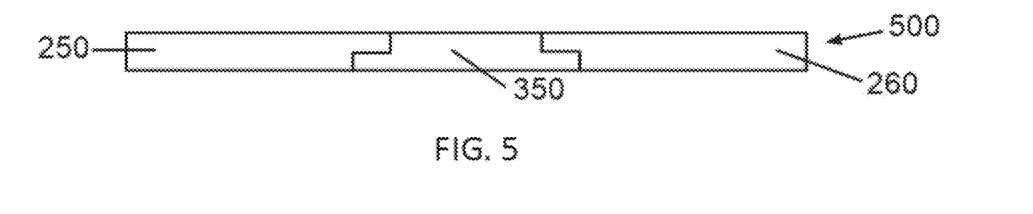
FIG. 5 is a cross section view of a separable three part bus bar according to this disclosure.
Figure 6A:
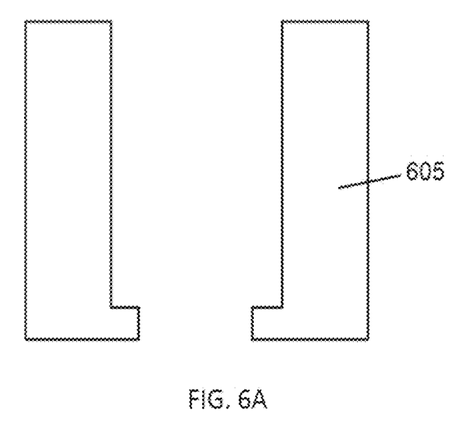
FIG. 6A is a cross section view of separable circuit breaker housing portions as described herein.
Figure 6B:
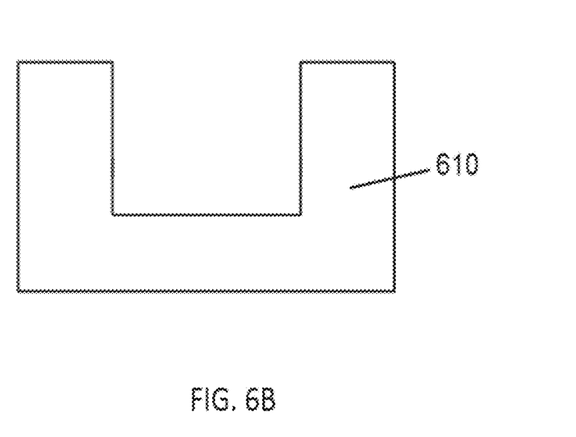
FIG. 6B is a cross section view of separable circuit breaker housing portions as described herein.

This embodiment is shown for example in FIGS. 3A, 3B, 4, 5, 6A, and 6B. This disclosure includes, therefore, a power circuit breaker 300 having a housing 600 that may be a single piece housing or have two separable housing parts 605, 610 as shown in FIGS. 3A, 3B, 6A, 6B. The housing defines a first passage 307 through the housing 600 and a cross passage 317 through the housing, wherein the first passage 307 and the cross passage 317 intersect inside the housing. A bus bar 500 extends through the cross passage of the housing, and the bus bar 500 is configured to transmit electric power and/or break transmission of the electric power through the housing 600. As shown in FIGS. 3A, 3B, and 5, the bus bar 500 includes at least an input section 250, a coin section 350, and an output section 260, and the input section, the coin section, and the output section are separable from each other. In some embodiments, the separable sections are re-usable after being separated by re-attaching the separable components into a single bus bar again for later use. The two part housing makes all parts of the bus bar accessible.

The housing 600 aligns a solenoid 305 and solenoid piston 308 within the first passage 307 of the housing. The solenoid piston 308 is surrounded by an electromagnet 327 connected to a power source 301. The solenoid 305 has a piston 308 with two opposite ends 322, 323 and one of the ends operates as a plunger to separate the sections of the bus bar when the solenoid is actuated. One of the two opposite ends 322, 323 of the solenoid piston, is, therefore, a plunger end 323 of the piston, and the plunger end has an insulated cap 325 thereon. In one embodiment, the insulated cap 325 is aligned with the coin section 350 of the bus bar 500 in the cross passage 317 of the housing 600.

A spring 375 within the first passage 307 of the housing engages a second portion 610 of the housing 600 and the coin section 350 of the bus bar 500 on a side of the bus bar opposite the insulated cap 325 of the solenoid piston. Linear motion of the solenoid piston through the first passage 307 provides corresponding motion of the coin section 350 of the bus bar onto the spring 375, disrupting an electric power transmission from the input section 250 to the output section 260 of the bus bar 500. In some embodiments, the spring 375 is formed of a nonconductive material or at least has a nonconductive coating. In other embodiments, the spring 375 may be replaced with a compressible polymer having a predetermined modulus of elasticity that serves the same functions as the spring 375 in opposing the solenoid piston 308. The solenoid piston 308 is typically made of a ferromagnetic material, but other materials can be used so long as the function of the solenoid is the same. As shown in FIG. 4, the solenoid piston 308 is generally linear with a first end 322 and a second end 323. In FIG. 4, the second end 323 of the solenoid piston fits into an insulating cap 325. The insulated cap may be over-molded onto the solenoid piston. The insulating cap 325 may define shoulders 333A, 333B that serve to stop travel of the piston and cap combination as the solenoid piston travels through the first passage 307 of the housing 600.

There are numerous configurations available to ensure that electricity flows across all sections of the bus bar 500 and through the housing 600 during normal operation but still allowing for a circuit break when circumstances require stopping electrical transmission. In one non-limiting embodiment, a positively powered solenoid 305 creates electric fields and magnetic fields, with the magnetic fields pulling the coin section 350 of the bus bar 500 toward the solenoid piston 308 and into alignment with the input section 250 and the output section 260 of the bus bar 500. In this embodiment, the spring 375 is biased against the power of the solenoid 305 to pull the coin section 350 and the insulated plunger end 323 out of connection with the input section 250 and output section 260 of the bus bar 500 against an active solenoid piston 308, when power to the electromagnet is reduced to a designated low power level on the solenoid to break the electric power transmission across the bus bar.

The solenoid and the spring may have opposite roles during times of circuit break operation, however, where the solenoid piston 308 is configured to move the coin section 350 of the bus bar 500 against the spring 375 and away from the input section 250 and output section 260 of the bus bar to break the electric power transmission. In that embodiment, the spring 375 is biased to push the coin section 350 into alignment with the rest of the bus bar 500 (i.e., connecting the input section 250 to the output section 260 for electrical transmission through the housing 600 until the solenoid activates the piston to overpower the spring force, breaking the circuit). In this embodiment, an activation signal from the power source activates the electromagnet to move the solenoid piston 308 toward the coin section 350 of the bus bar; push the coin section 350 of the bus bar out of contact with the input section 250 and the output section 260 of the bus bar; and position the insulated cap 325 between the input section and output section of the bus bar to break the electric power transmission across the bus bar. This process is illustrated in FIG. 3B.

In optional embodiments, a locking mechanism holds the coin section 350 proximately to the housing and disconnected from the input section 250 and the output section 260 of the bus bar during periods of circuit break that discontinues the electric power transmission across the bus bar. The housing may be made of or coated with an insulating material, at least in part, to reduce unwanted conduction across the housing. The locking mechanism holds the coin section proximately to the insulating housing 600 during periods of a circuit break that discontinues the electric power transmission across the bus bar 500, wherein the locking mechanism separates the coin section from the input section and the output section with the insulating material of the housing to reduce arcing. As shown in the non-limiting embodiments of the figures, the housing defines respective air filled chambers 380A, 380B between the spring 375 and the housing 600, and the assembly prevents arcing therein.

In non-limiting embodiments of this disclosure, transient electrical energy on the bus bar 500, particularly energy on the input section 250 and output section 260, may be sent to a diverting terminal in the insulated cap 325 configured to connect the input section and/or the output section of the bus bar to a respective electric power diverting circuit when the solenoid piston is activated (or deactivated) in a way that breaks the electrical circuit transmission. In this embodiment, a respective power diverting circuit is attached to a load that receives transient electrical power remaining on the input section of the bus bar and/or the output section of the bus bar after a circuit break operation. The load may be an energy harvesting device, and the energy harvesting device includes at least one of a capacitor, a battery, a solenoid, a latched spring, and a mass-damper system. The electric power diverting circuit may also include an energy harvesting device that is charged during periods in which the solenoid piston is activated (or deactivated) to disrupt electric power transmission from the input section to the output section of the bus bar. A reset button may also be used to remove power to the electromagnet and allows for the power circuit breaker to be reset with electric power transmission across the bus bar.

Yet another embodiment is achieved through a combination of electrical (e.g. FET) and electromechanical as needed to create more complex high power, high current circuits with controlled "switching" of circuit legs or junctions such that the goals of the state of the art pyrotechnical circuit termination can be achieved while allowing circuit legs/junctions to be nearly immediately resettable electrically or mechanically (e.g. pushing a release button, similar to circuit breaker release or changing the gate voltage on an FET).

The embodiments of this disclosure all allow for harnessing transient energy which is produced during the disruption process that can then be used in the process of resetting the circuit as described herein. For example, a secondary and/or tertiary (and any number of multiple, N) electrical circuits can be temporarily engaged immediately during the termination process such that current temporarily flows in the secondary (and any number of multiple circuits) such that the 1–N secondary circuits. These secondary (N) circuits may have an electromechanical energy storage method (e.g. capacitor, solenoid, battery, spring/latch . . . ) which transfers the electrical energy (and thus dissipates associated heat and/or mitigates plasma generation, arcing, etc.). In order to reset the circuit, the stored energy could be used in the process (e.g. electromechanically activating a solenoid or spring latch release).

In other examples of the secondary circuits, transient energy may be harnessed and directed to an electromechanical mass-damper system that dissipates undesirable transient energy released during the circuit disruption. Similarly, the same methods could be used in the reverse order (e.g. dissipate and/or store) energy used in the "reset" process that could be available and used for other functions.

Figure 7A:
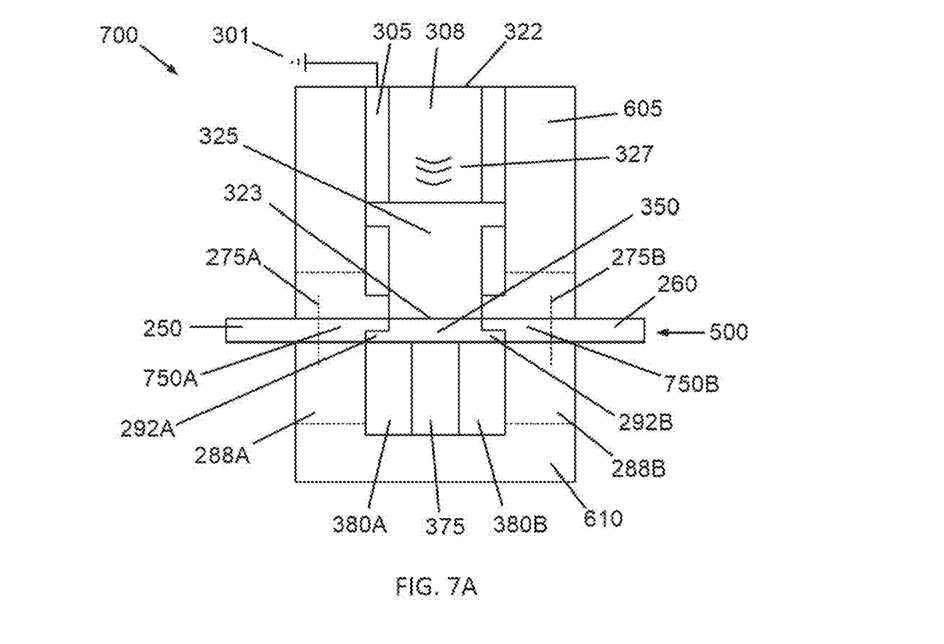
FIG. 7A is a cross section view of a circuit breaker as disclosed herein in a de-activated state and utilizing a hinged bus bar.
Figure 7B:
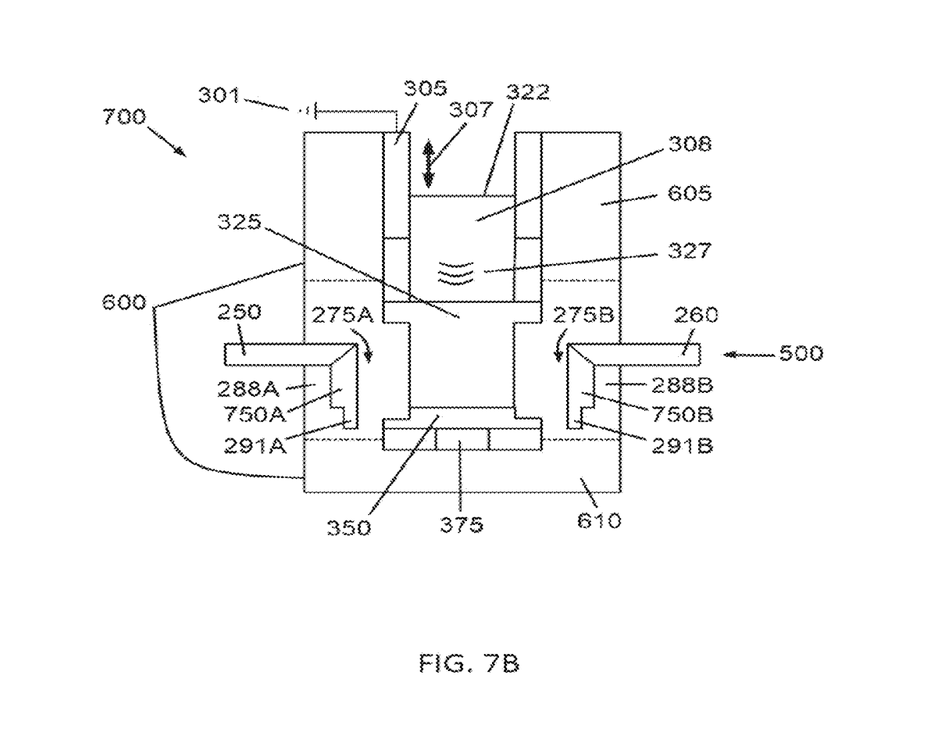
FIG. 7B is a cross section view of a circuit breaker as disclosed herein in an activated state and utilizing a hinged bus bar.

This disclosure further includes a system to connect and disconnect electric power transmission through a power circuit breaker 700. In this system, not only the coin 350, or center section, of the bus bar 500 moves to disrupt electrical power, but the input section 250 and the output section 260 may partially move to direct opposite ends to insulating grounds or other diverting circuits. Components of the system include a multi-section bus bar 500 extending through a power circuit breaker housing, and the housing 600 supports an input section and an output section on opposite sides of a cross channel 317 through the housing. The bus bar includes at least five sections, the input section 250 connected to grid power, a first swing section 750A of the bus bar 500 connected at a first end, by a hinge 275A, to the input section 250 and connected at a second end to a separable center section 350 of the bus bar 500. The output section 260 of the bus bar 500 that is connected to the bus bar load in normal operation may include a second swing section 750B of the bus bar 500 connected at a respective first end to the separable center section 350 of the bus bar and connected, by a respective hinge 275B, at a respective second end to the output section 260 of the bus bar 500. The first swing section and the second swing section each include respective lips 291A, 291B that mate with corresponding ledges 292A, 292B on the separable center section 350 of the bus bar. A spring 375 is connected to the housing and supports the separable center section. The spring 375 is biased to connect the separable center section to the first swing section 750A and the second swing section 750B to conduct electric power across the bus bar. A solenoid piston 308 includes an insulated cap 325 on a plunger end 323 of the solenoid piston, wherein the plunger end of the solenoid piston is aligned with the center section of the bus bar through the housing. An electromagnet 327 surrounds at least a portion of the solenoid piston and is connected to a power source 301. In this non-limiting embodiment, an activation signal from the power source 301 activates the electromagnet to move the solenoid piston toward the center section of the bus bar; push the center section 350 of the bus bar out of contact with the first swing section 750A and the second swing section 750B of the bus bar; and position the insulated cap between the input section and output section of the bus bar to break the electric power transmission across the bus bar. When the center section of the bus bar breaks, the first swing section and the second swing section of the bus bar drop or swing from the hinges 275A, 275B toward the housing 600 to separate the input section from the output section and prevent arcing. The housing defines clearance openings 288A, 288B to accommodate the swing.

As in other embodiments, a locking mechanism may be included for connecting the termination ends of the swing sections to an insulated portion of the housing in a fixed position. In optional configurations, the locking mechanism connects the termination ends of the swing sections to respective diversion circuits through the housing, wherein at least one of the diversion circuits charges an energy harvesting device. The energy harvesting circuits that may benefit from the embodiments of this disclosure include at least one of a capacitor, a battery, a solenoid, a latched spring, and a mass-damper system.

A reset button may be utilized to mechanically re-align the input section, the first swing section, the center section, the second swing section, and the output section for electric power transmission across the bus bar after a circuit break activation.

Figure 8:
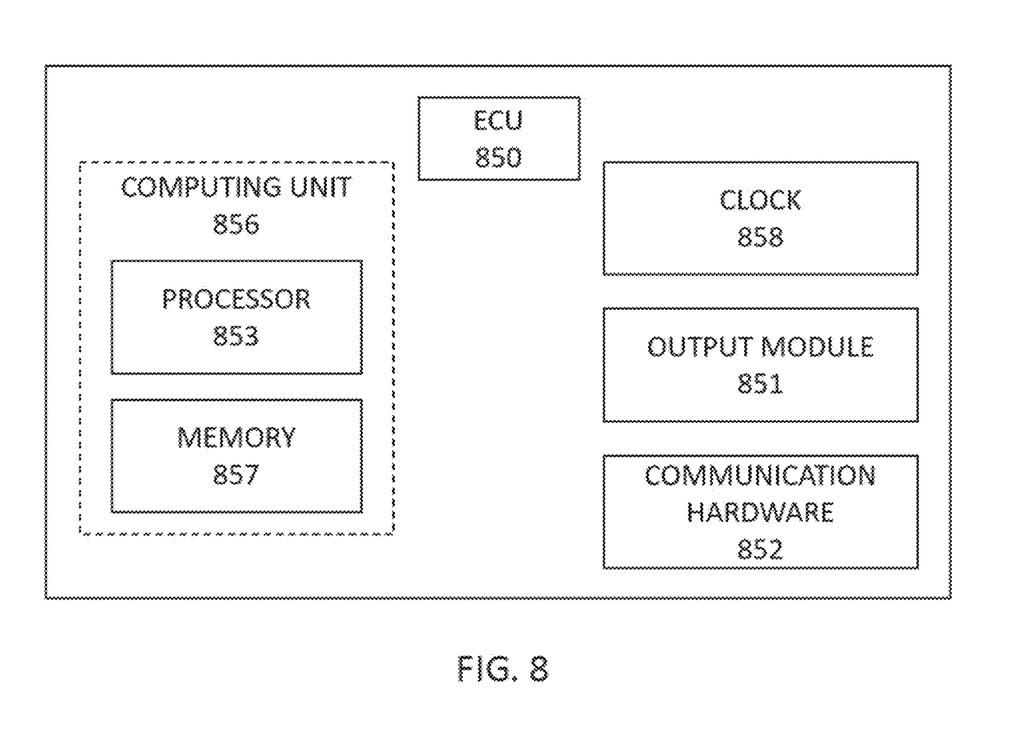
FIG. 8 is a schematic illustration of a computer environment in which the circuit breakers of this disclosure are controlled from an electronic control unit.

Implementations described above and in relation to FIGS. 1 through 7B may be used with equipment that implements computerized methods that are activated with an electronic control unit ("ECU") 850, represented by FIG. 8. The electronic control unit may be programmed to control the above described solenoid and FET embodiments with solid state electronics. In particular, the described equipment, communicate with a computer processor 853 configured to process one or more characteristics and/or profiles of the electrical signals received. The ECU 850 may include a computing unit 856, a system clock 858, an output module 851 and communication hardware 852. In its most basic form, the computing unit may include a processor and a system memory. The processor may be a standard programmable processor that performs arithmetic and logic operations necessary for operation of the circuit breaker system. The processor may be configured to execute program code encoded in tangible, computer-readable media. For example, the processor may execute program code stored in the system memory 857, which may be volatile or non-volatile memory. The system memory is only one example of tangible, computer-readable media. In one aspect, the computing unit can be considered an integrated device such as firmware. Other examples of tangible, computer-readable media include floppy disks, CD-ROMs, DVDs, hard drives, flash memory, or any other machine-readable storage media, wherein when the program code is loaded into and executed by a machine, such as the processor 853, the machine becomes an apparatus for practicing the disclosed subject matter.

For purposes of this disclosure, the term "coupled" means the joining of two components (electrical, mechanical, or magnetic) directly or indirectly to one another. Such joining may be stationary in nature or movable in nature. Such joining may be achieved with the two components (electrical or mechanical) and any additional intermediate members being integrally defined as a single unitary body with one another or with the two components or the two components and any additional member being attached to one another. Such joining may be permanent in nature or alternatively may be removable or releasable in nature.

The present disclosure has been described with reference to example embodiments, however persons skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

It is also important to note that the construction and arrangement of the elements of the system as shown in the preferred and other exemplary embodiments is illustrative only. Although only a certain number of embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the assemblies may be reversed or otherwise varied, the length or width of the structures and/or members or connectors or other elements of the system may be varied, the nature or number of adjustment or attachment positions provided between the elements may be varied. It should be noted that the elements and/or assemblies of the system may be constructed from any of a wide variety of materials that provide sufficient strength or durability.

Accordingly, all such modifications are intended to be included within the scope of the present disclosure. Other substitutions, modifications, changes and omissions may be made in the design, operating conditions and arrangement of the preferred and other exemplary embodiments without departing from the spirit of the present subject matter.

In example implementations, at least some portions of the activities may be implemented in software provisioned on a networking device, such as software controlling solenoids and transistors used in the circuit breaker embodiments. In some embodiments, one or more of these features may be implemented in computer hardware, provided external to these elements, or consolidated in any appropriate manner to achieve the intended functionality.

Furthermore, computer systems described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that single processor and a single memory element are responsible for certain activities. In a general sense, the arrangements depicted in the Figures may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory can store data used for the operations described herein. This includes the memory being able to store instructions (e.g., software, logic, code, etc.) in non-transitory media, such that the instructions are executed to carry out the activities described in this Specification. A processor can execute any type of computer readable instructions associated with the data to achieve the operations detailed herein in this Specification. In one example, processors (e.g., processor) could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. Any of the memory items discussed herein should be construed as being encompassed within the broad term 'memory element.' Similarly, any of the potential processing elements, modules, and machines described in this Specification should be construed as being encompassed within the broad term 'processor.'

The invention claimed is:

1. A circuit breaker system, comprising:
 a field effect transistor comprising a source terminal, a gate terminal, and a drain terminal attached to a substrate body to control electrical conduction there through;
 a bus bar for electrical power transmission, comprising an input section connected to the source terminal and an output section connected to the drain terminal of the field effect transistor;
 a separate control voltage connected to the substrate at the gate terminal, wherein a positive voltage bias on the gate terminal provides a path for the electrical power transmission through the substrate, and a negative voltage bias on the gate terminal breaks electrical power through the substrate;

wherein the substrate is doped to establish a p-n junction sufficient to withstand the electric power transmission and break the circuit from source to drain when the gate terminal is reverse biased; and wherein a reverse biased gate terminal comprises a gate voltage that is iteratively lowered over time;

wherein the time over which the gate voltage is lowered corresponds to a response time of the substrate in establishing the p-n junction that discontinues electric power transmission from the source to the drain.

2. The circuit breaker system of claim 1, wherein at least one of a size of the substrate, a shape of the field effect transistor, a doping profile of the substrate, and a silicon mass of the substrate corresponds to a thermal conductivity response of the substrate during electric power transmission.

3. The circuit breaker system of claim 1, wherein the gate voltage is controlled by an electronic control unit comprising a processor and computerized memory storing electric power transmission software therein.

4. The circuit breaker system of claim 1, further comprising an external packaging connected to the field effect transistor as a heat sink to dissipate thermal loading across the substrate.

* * * * *